United States Patent
Asahata et al.

(10) Patent No.: US 9,111,717 B2
(45) Date of Patent: Aug. 18, 2015

(54) ION BEAM APPARATUS

(71) Applicant: HITACHI HIGH-TECH SCIENCE CORPORATION, Tokyo (JP)

(72) Inventors: Tatsuya Asahata, Tokyo (JP); Yasuhiko Sugiyama, Tokyo (JP); Hiroshi Oba, Tokyo (JP)

(73) Assignee: HITACHI HIGH-TECH SCIENCE CORPORATION (JP)

( * ) Notice: Subject to any disclaimer, the term of this patent is extended or adjusted under 35 U.S.C. 154(b) by 0 days.

(21) Appl. No.: 13/845,582

(22) Filed: Mar. 18, 2013

(65) Prior Publication Data
US 2013/0248732 A1    Sep. 26, 2013

(30) Foreign Application Priority Data
Mar. 23, 2012    (JP) .................... 2012-068016

(51) Int. Cl.
    *H01J 37/10*    (2006.01)
    *H01J 37/302*    (2006.01)
    *H01J 37/305*    (2006.01)

(52) U.S. Cl.
CPC ............... *H01J 37/10* (2013.01); *H01J 37/302* (2013.01); *H01J 37/3056* (2013.01); *H01J 2237/0206* (2013.01); *H01J 2237/04924* (2013.01); *H01J 2237/216* (2013.01); *H01J 2237/24535* (2013.01); *H01J 2237/31749* (2013.01)

(58) Field of Classification Search
CPC ....... H01J 37/26; H01J 37/28; H01J 37/3023; H01J 2237/30461; H01J 37/10; H01J 2237/216; H01J 2237/21; H01J 2237/24535
See application file for complete search history.

(56) References Cited

U.S. PATENT DOCUMENTS

| | | | | |
|---|---|---|---|---|
| 6,118,122 A | * | 9/2000 | Koyama et al. | 850/43 |
| 6,259,960 B1 | * | 7/2001 | Inokuchi | 700/110 |
| 8,552,397 B2 | * | 10/2013 | Madokoro et al. | 250/396 R |
| 2002/0008208 A1 | * | 1/2002 | Muto et al. | 250/423 R |
| 2003/0173527 A1 | * | 9/2003 | Adachi et al. | 250/492.21 |
| 2006/0027765 A1 | * | 2/2006 | Gierak et al. | 250/493.1 |
| 2008/0135752 A1 | * | 6/2008 | Motoi | 250/309 |
| 2009/0230299 A1 | * | 9/2009 | Shichi et al. | 250/282 |
| 2010/0116984 A1 | * | 5/2010 | Ogawa et al. | 250/307 |
| 2010/0301211 A1 | * | 12/2010 | Miller | 250/307 |
| 2012/0217152 A1 | * | 8/2012 | Miller | 204/192.34 |

FOREIGN PATENT DOCUMENTS

JP    10106474    4/1998

* cited by examiner

*Primary Examiner* — Jack Berman
*Assistant Examiner* — Wyatt Stoffa
(74) *Attorney, Agent, or Firm* — Adams & Wilks

(57) ABSTRACT

An ion beam apparatus includes an ion source configured to emit an ion beam, a condenser lens electrode that condenses the ion beam, and a condenser lens power source configured to apply a voltage to the condenser lens electrode. A storage portion stores a first voltage value, a second voltage value, a third voltage value, and a fourth voltage value. A control portion retrieves the third voltage value from the storage portion and sets the retrieved third voltage value to the condenser lens power source when an observation mode is switched to a wide-range observation mode, and retrieves the fourth voltage value from the storage portion and sets the retrieved fourth voltage value to the condenser lens power source when a processing mode is switched to the wide-range observation mode.

6 Claims, 4 Drawing Sheets

ION BEAM APPARATUS

CROSS-REFERENCE TO RELATED APPLICATIONS

This application claims priority from Japanese Patent Application No. 2012-068016 filed on Mar. 23, 2012, the entire contents of which are incorporated herein by reference.

TECHNICAL FIELD

Aspects of the present invention relate to an ion beam apparatus for processing and observing a sample by an ion beam.

BACKGROUND

A focused ion beam (FIB) apparatus for performing etching processing and microscopic observation has been known.

In the focused ion beam apparatus, in general, when a sample is processed, the sample is irradiated with an ion beam having a large current amount, to thereby subject the sample to etching processing. On the other hand, when the sample is observed, the sample is irradiated with an ion beam having a small current amount in order to reduce the etching amount of the sample and reduce the beam diameter, and then secondary charged particles generated from the sample are detected to perform microscopic observation of the sample.

Further, in the focused ion beam apparatus, in general, the current amount of the ion beam to be radiated is changed depending on the processing rate and accuracy. To change the current amount, it is necessary to change the settings of ion beam optics. For example, there is known an ion beam apparatus in which conditions of ion beam optics for different current amounts are stored, and at the time of beam switching, corresponding optics conditions are read and set to the optics (see JP-A-H10-106474).

According to this apparatus, in the case of switching between ion beams having different current amounts, the optics conditions can be switched smoothly.

In the FIB apparatus, in order to set an irradiation position when performing fine processing, the sample is observed at a high magnification. On the other hand, in order to check the position of a processing target, it is also necessary to observe the sample in a wide range, and hence the sample is sometimes observed at a low magnification. In this case, beam switching is performed in a manner that the apparatus stores in advance the optics conditions for a wide-range observation mode where the sample is scanned and irradiated with the ion beam in a wide range. For the beam switching, it is necessary to switch the voltage to be applied to a lens electrode of the optics.

However, there is a problem in that, in the case where the voltage to be applied to the lens electrode of the optics is switched, if a high voltage is abruptly applied to the lens electrode, discharge is generated. Accordingly, the beam switching to apply a high voltage needs to be performed so that the voltage is increased gradually so as not to generate discharge. Thus, there has been a problem in that it takes time for the beam switching to be performed.

SUMMARY

Aspects of the present invention provide an ion beam apparatus capable of shortening a time period necessary for beam switching without generating discharge in ion beam optics.

According to an aspect of the present invention, there is provided an ion beam apparatus including: an ion source configured to emit an ion beam; a condenser lens electrode configured to form a condenser lens for condensing the ion beam; a condenser lens power source configured to apply a voltage to the condenser lens electrode; a storage portion configured to store, a first voltage value to be applied to the condenser lens electrode and corresponding to an observation mode of irradiating a sample with the ion beam to observe the sample, a second voltage value to be applied to the condenser lens electrode and corresponding to a processing mode of irradiating the sample with the ion beam having a larger current amount than a current amount in the observation mode, a third voltage value to be applied to the condenser lens electrode and corresponding to a wide-range observation mode of irradiating the sample with the ion beam in a wider range than a range in the observation mode, and a fourth voltage value corresponding to the wide-range observation mode and being closer to the second voltage value with respect to the third voltage value; and a control portion configured to retrieve the third voltage value from the storage portion and set the retrieved third voltage value to the condenser lens power source when the observation mode is switched to the wide-range observation mode, and retrieve the fourth voltage value from the storage portion and set the retrieved fourth voltage value to the condenser lens power source when the processing mode is switched to the wide-range observation mode.

According to another aspect of the present invention, there is provided an ion beam apparatus including: an ion source configured to emit an ion beam; a condenser lens electrode configured to form a condenser lens for condensing the ion beam; a condenser lens power source configured to apply a voltage to the condenser lens electrode; a storage portion configured to store, a first voltage value to be applied to the condenser lens electrode and corresponding to an observation mode of irradiating a sample with the ion beam to observe the sample, a second voltage value to be applied to the condenser lens electrode and corresponding to a processing mode of irradiating the sample with the ion beam having a larger current amount than a current amount in the observation mode, a third voltage value to be applied to the condenser lens electrode and corresponding to a wide-range observation mode of irradiating the sample with the ion beam in a wider range than a range in the observation mode, and a fourth voltage value corresponding to the wide-range observation mode and by which a lens having a stronger lens effect than a lens effect of the condenser lens formed in the processing mode is formed; and a control portion configured to retrieve the third voltage value from the storage portion and set the retrieved third voltage value to the condenser lens power source when the observation mode is switched to the wide-range observation mode, and retrieve the fourth voltage value from the storage portion and set the retrieved fourth voltage value to the condenser lens power source when the processing mode is switched to the wide-range observation mode.

Accordingly, a difference in voltage values to be changed for beam switching can be reduced. Thus, the time period necessary for beam switching can be shortened without generating discharge.

DETAILED DESCRIPTION

An ion beam apparatus according to an exemplary embodiment of the present invention is described below.

Figure 1:
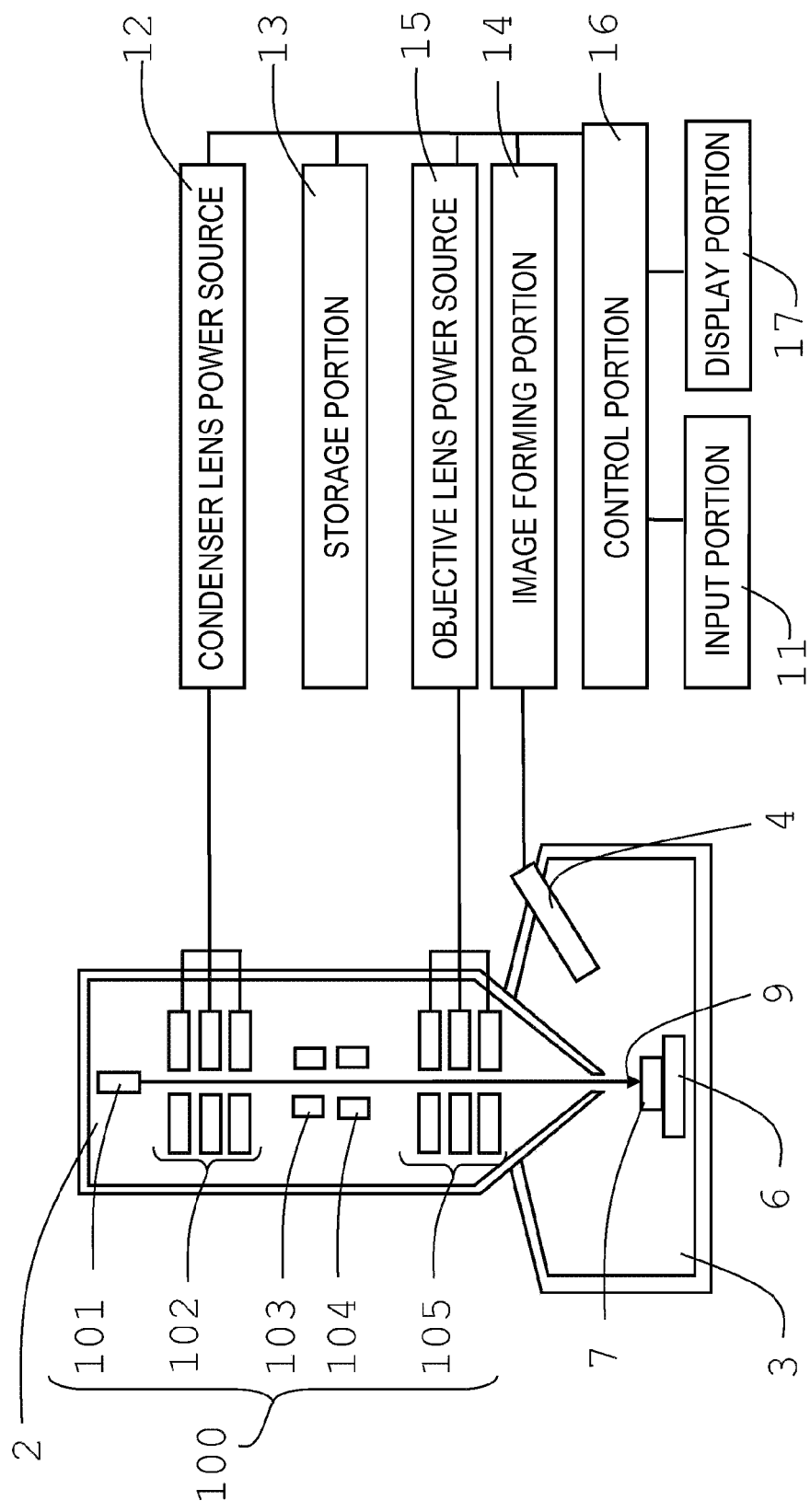
FIG. 1 is a configuration diagram of an ion beam apparatus according to an exemplary embodiment of the present invention.

As illustrated in FIG. 1, the ion beam apparatus in the exemplary embodiment includes a FIB column 2 and a sample chamber 3. The FIB column 2 irradiates a sample 7 accommodated in the sample chamber 3 with an ion beam 9.

The ion beam apparatus includes a secondary electron detector 4 as a charged particle detector. The secondary electron detector 4 is capable of detecting secondary electrons generated from the sample 7 by irradiation of the ion beam 9.

The ion beam apparatus includes an image forming portion 14 and a display portion 17. The image forming portion 14 forms data of a SIM image based on a signal for scanning the ion beam 9 and a signal of the secondary electrons detected by the secondary electron detector 4. The display portion 17 is capable of displaying the SIM image.

The ion beam apparatus includes a sample stage 6 for placing the sample 7 thereon. The sample stage 6 can move the sample 7. Further, the sample stage 6 can be tilted to change an incident angle of the ion beam 9 to the sample 7.

The FIB column 2 includes ion beam optics 100. The ion beam optics 100 includes an ion source 101, a condenser lens electrode 102, an astigmatism correction electrode 103, a scanning electrode 104, and an objective lens electrode 105. The ion source 101 emits the ion beam 9. The condenser lens electrode 102 forms a condenser lens for condensing the ion beam 9 emitted from the ion source 101. The astigmatism correction electrode 103 corrects astigmatism of the ion beam 9. The scanning electrode 104 scans the ion beam 9. The objective lens electrode 105 forms an objective lens for focusing the ion beam 9 onto the surface of the sample 7. Note that, the condenser lens electrode 102 and the objective lens electrode 105 are each formed of a disc member having a hole for allowing the ion beam 9 to pass therethrough.

The ion beam apparatus further includes an input portion 11 and a control portion 16. An operator inputs information on irradiation conditions of the ion beam 9 to the input portion 11. The input portion 11 transmits the input information to the control portion 16. The control portion 16 retrieves data on corresponding irradiation conditions from a storage portion 13 storing data on irradiation conditions. Based on the retrieved data, the control portion 16 sets, to a condenser lens power source 12 and an objective lens power source 15, respective voltage values to be applied to the condenser lens electrode 102 and the objective lens electrode 105. The condenser lens power source 12 and the objective lens power source 15 apply the setting voltages to the condenser lens electrode 102 and the objective lens electrode 105, to thereby form a condenser lens and an objective lens, respectively. In this manner, the sample 7 is irradiated with the ion beam 9 under the irradiation conditions based on the information input via the input portion 11.

Figure 2A:
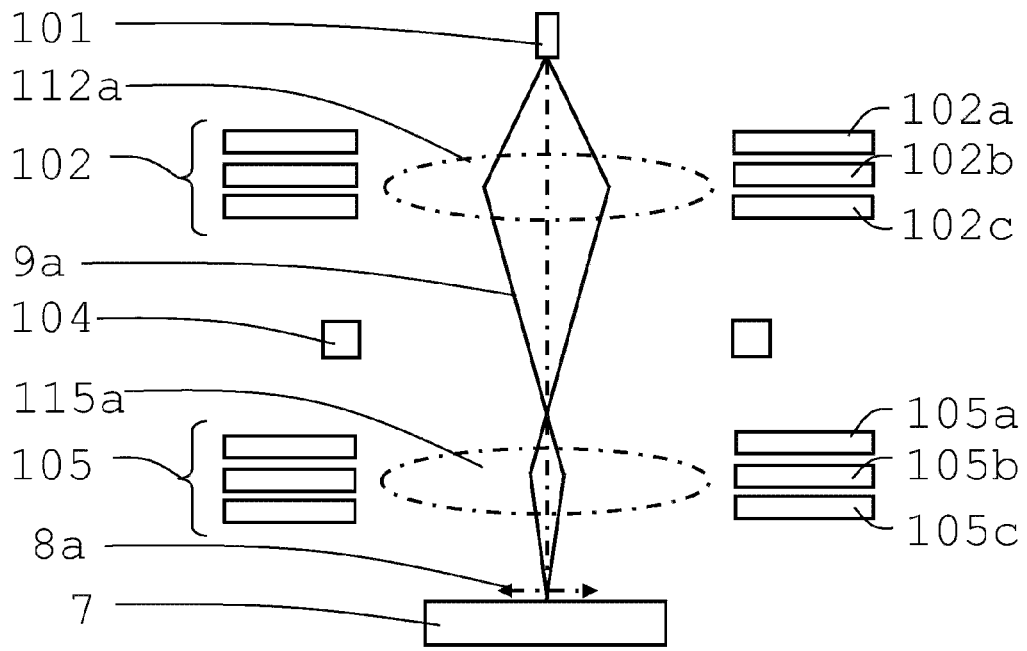
FIGS. 2A and 2B are explanatory diagrams of irradiation modes of the ion beam apparatus according to an exemplary embodiment of the present invention.

Next, description is given of irradiation modes of the ion beam 9. FIG. 2A illustrates a locus 9a of the ion beam 9 in the case where the sample 7 is irradiated with the ion beam 9 in an observation mode. The observation mode is an irradiation mode to be used for observing the sample 7, and has irradiation conditions where the sample 7 is irradiated with an ion beam 9 having a small beam current amount in order to reduce damage to the sample 7, in other words, to reduce the amount of sputter etching of the sample 7. In the observation mode, the ion beam 9 is condensed so that the beam diameter becomes smaller on the surface of the sample 7 in order to observe the sample 7 with a high resolution.

In the observation mode, a condenser lens electric field 112a for strongly bending the ion beam 9 is formed. The locus 9a of the ion beam 9 strongly bent by the condenser lens electric field 112a is focused onto the surface of the sample 7 by an objective lens electric field 115a.

In the observation mode, in order to strongly bend the ion beam 9, a large voltage is applied to the condenser lens electrode 102. In this case, a first electrode 102a of the condenser lens electrode 102 on the ion source 101 side is set to 23 kV, a second electrode 102b is set to 27 kV, and a third electrode 102c is set to 0 kV. In this manner, the locus 9a of the ion beam 9 is strongly bent by the condenser lens electric field 112a, resulting in loci that cross over inside the FIB column 2.

Figure 2B:
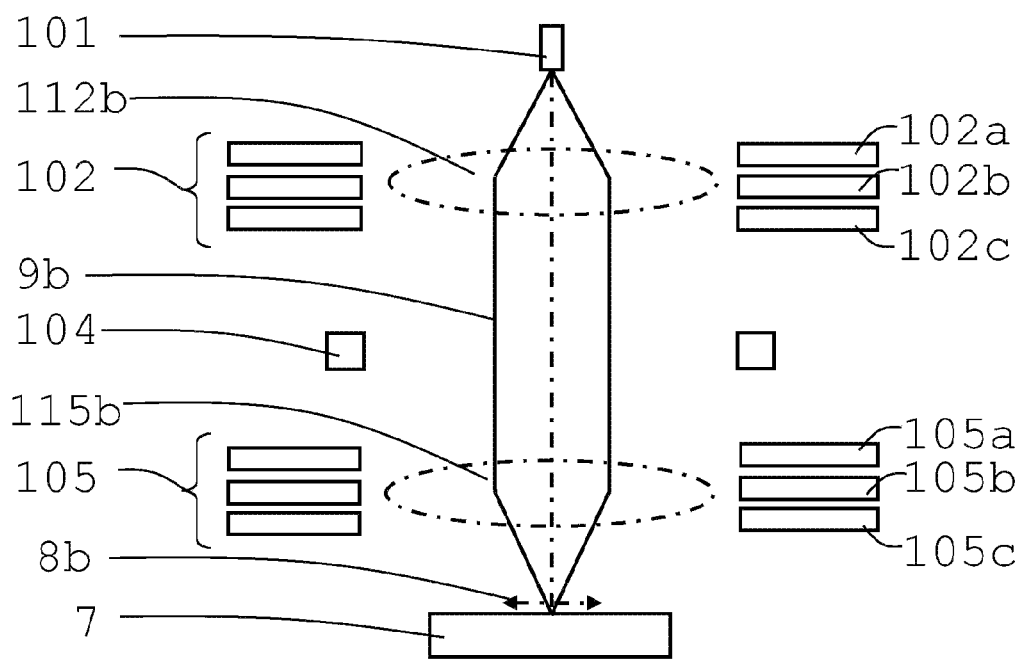

FIG. 2B illustrates a locus 9b of the ion beam 9 in the case where the sample 7 is irradiated with the ion beam 9 in a processing mode. The processing mode is an irradiation mode to be used for subjecting the sample 7 to etching processing, and has irradiation conditions where the sample 7 is irradiated with an ion beam 9 having a large beam current amount in order to subject the sample 7 to etching processing at high speed.

In the processing mode, a condenser lens electric field 112b for condensing the ion beam 9 in large amounts is formed. The locus 9b of the ion beam 9 is almost parallel until reaching an objective lens electric field 115b. In this manner, the sample 7 can be irradiated with the ion beam 9 having a large beam current amount.

In the processing mode, a voltage smaller than that in the observation mode is set to the condenser lens electrode 102. In this case, the voltages to be set to the first electrode 102a and the third electrode 102c of the condenser lens electrode 102 are the same as those in the observation mode, and the voltage of the second electrode 102b is set to 0 kV. In this manner, the locus 9b of the ion beam 9 becomes a parallel locus inside the FIB column 2 by the condenser lens electric field 112b, and hence the ion beam 9 can be condensed in large amounts.

As described above, the irradiation conditions for the observation mode are set to the ion beam optics 100 in the case of observing the sample 7, and the irradiation conditions for the processing mode are set to the ion beam optics 100 in the case of processing the sample 7. Thus, the sample 7 can be irradiated with a desired ion beam 9.

Figure 3A:
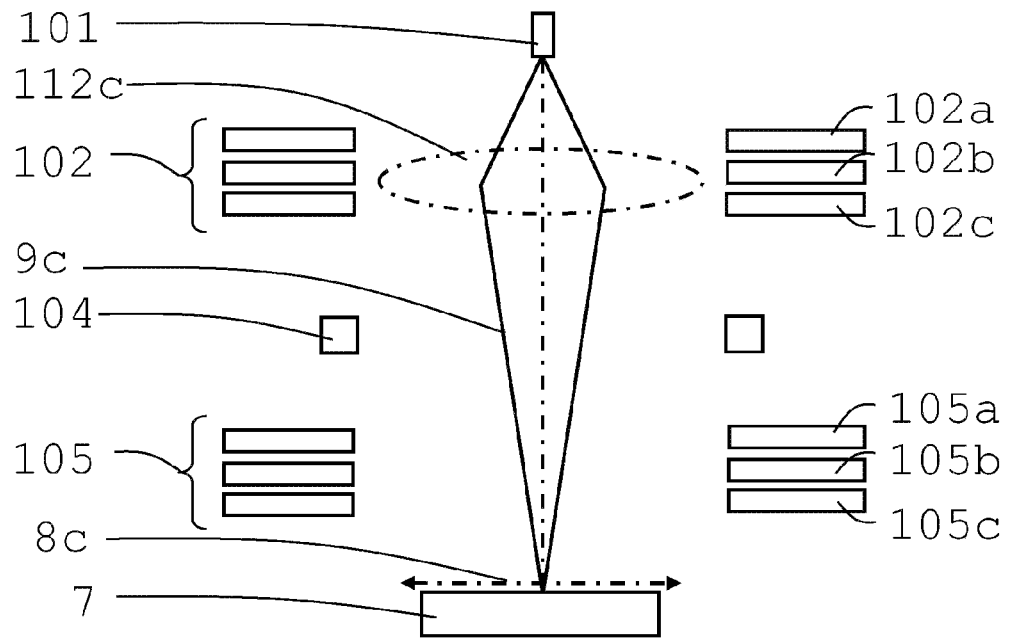
FIGS. 3A and 3B are explanatory diagrams of irradiation modes of the ion beam apparatus according to an exemplary embodiment of the present invention.

Next, description is given of a wide-range observation mode for observing a wide range. FIG. 3A illustrates a locus 9c of the ion beam 9 in the case where the sample 7 is irradiated with the ion beam 9 in the wide-range observation mode. In the wide-range observation mode, no objective lens is formed but a condenser lens electric field 112c is formed so as to focus the ion beam 9 onto the surface of the sample 7. In this manner, the ion beam 9 can be scanned by the scanning electrode 104 without using any objective lens, and hence the ion beam 9 can be scanned and irradiated in a wide range. The wide range as used herein refers to a wide scanning range 8c and a wide scanning range 8d of about 5 mm, as compared with a scanning range 8a in the observation mode and a scanning range 8b in the processing mode of about 1 mm.

In the wide-range observation mode, in order to focus the ion beam 9 onto the surface of the sample 7 by the condenser lens alone, a voltage of 20 kV is applied to the second electrode 102b of the condenser lens electrode 102. Note that, the voltages to be applied to the first electrode 102a and the third electrode 102c of the condenser lens electrode 102 are the same as those in the observation mode. That is, the voltages are applied so that a potential difference between the first electrode 102a and the second electrode 102b is 3 kV and a potential difference between the second electrode 102b and the third electrode 102c is 20 kV. In this manner, a strong lens electric field is formed by the second electrode 102b and the third electrode 102c, to thereby focus the ion beam 9 onto the surface of the sample 7. In this case, the voltage of the objective lens electrode 105 is set to 0 kV.

Figure 3B:
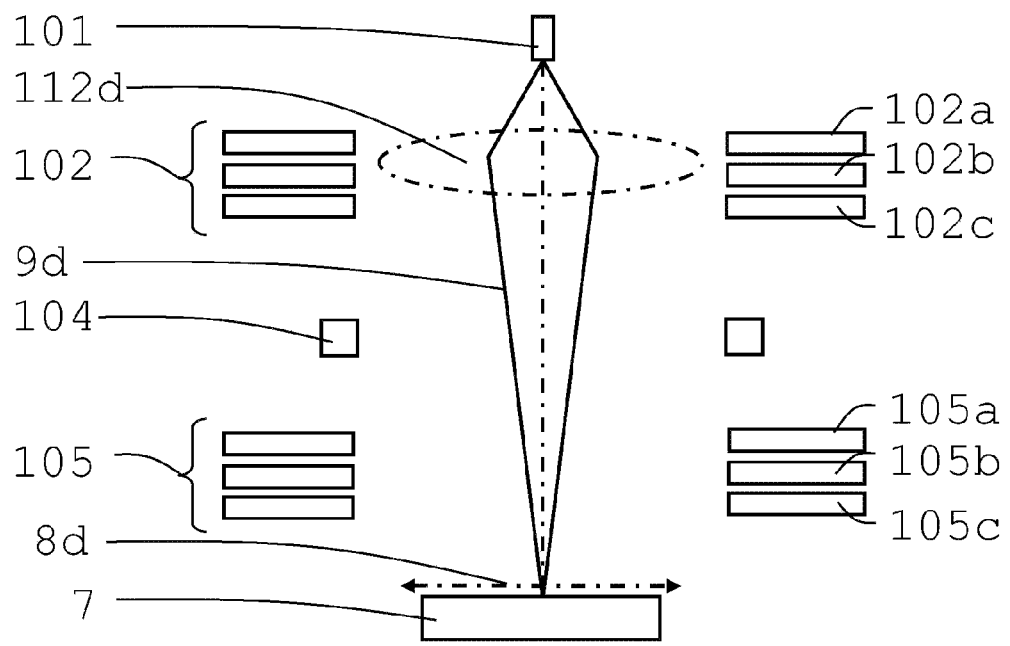

Further, in the exemplary embodiment, there is another wide-range observation mode. FIG. 3B illustrates a locus 9d of the ion beam 9 in the case where the sample 7 is irradiated with the ion beam 9 in the other wide-range observation mode. In the other wide-range observation mode, a voltage of −5 kV is applied to the second electrode 102b of the condenser lens electrode 102. Note that, the voltages to be applied to the first electrode 102a and the third electrode 102c of the condenser lens electrode 102 are the same as those in the processing mode. That is, the voltages are applied so that a potential difference between the first electrode 102a and the second electrode 102b is 28 kV and a potential difference between the second electrode 102b and the third electrode 102c is −5 kV. In this manner, a strong lens electric field is formed by the first electrode 102a and the second electrode 102b, to thereby focus the ion beam 9 onto the surface of the sample 7. In this case, the voltage of the objective lens electrode 105 is set to 0 kV.

As described above, in the exemplary embodiment, the wide-range observation mode has two modes, the mode of applying a voltage of 20 kV to the condenser lens electrode 102 and the mode of applying a voltage of −5 kV to the condenser lens electrode 102. Then, an optimum wide-range observation mode is used depending on whether the irradiation mode before the use of the wide-range observation mode is the observation mode or the processing mode.

In other words, when the irradiation mode is switched from the processing mode to the wide-range observation mode, the irradiation mode is switched to the wide-range observation mode of applying a voltage of −5 kV. This is because a voltage of 0 kV is set to the condenser lens electrode 102 in the processing mode, and hence, if the irradiation mode is switched to the wide-range observation mode of applying a voltage of 20 kV, a large voltage will be applied and discharge may be generated. In this manner, a time period necessary for switching from the processing mode to the wide-range observation mode can be shortened. In other words, since the application voltage is switched from 0 kV to −5 kV, the switching can be performed in a time period which is ¼ as compared with the case where the voltage is switched from 0 kV to 20 kV.

On the other hand, when the irradiation mode is switched from the observation mode to the wide-range observation mode, the irradiation mode is switched to the wide-range observation mode of applying a voltage of 20 kV, because a voltage of 23 kV is set to the condenser lens electrode 102 in the observation mode. In this manner, the irradiation mode can be switched from the wide-range observation mode to the observation mode again without applying a large voltage. Thus, the switching time period can be shortened without generating discharge.

Figure 4:
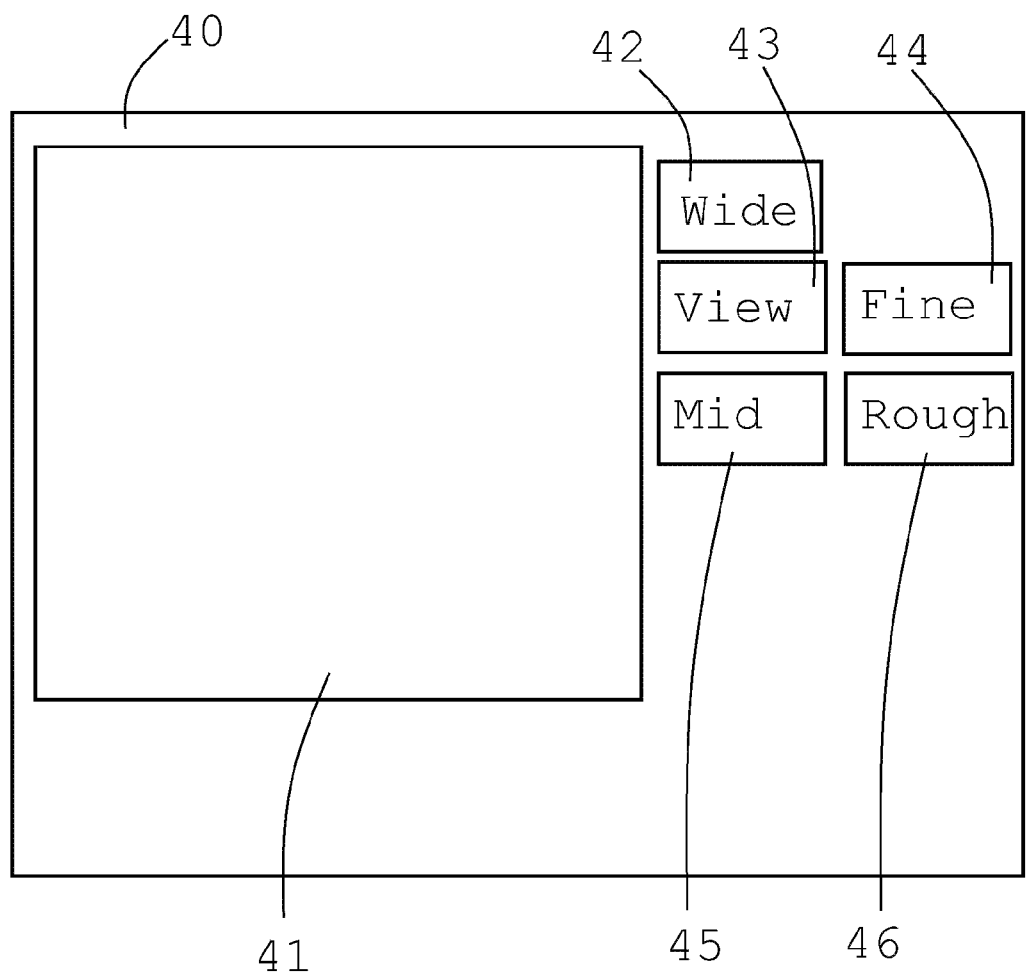
FIG. 4 is an explanatory diagram of a display screen of the ion beam apparatus according to an exemplary embodiment of the present invention.

Next, description is given of how to switch the irradiation mode with reference to FIG. 4. FIG. 4 is a display screen 40 displayed on the display portion 17. The display screen 40 includes an observation mode button 43 for switching to the observation mode, a processing mode button (low current) 44 for switching to a processing mode for irradiation of the ion beam 9 with a low current, a processing mode button (intermediate current) 45 for switching to a processing mode for irradiation of the ion beam 9 with an intermediate current, and a processing mode button (high current) 46 for switching to a processing mode for irradiation of the ion beam 9 with a high current.

The operator switches the irradiation mode of the ion beam 9 through the above-mentioned button via the input portion 11, such as a mouse and a keyboard, while looking at a SIM image 41 displayed on the display screen. In this manner, an irradiation mode switching signal is input to the control portion 16.

The control portion 16 retrieves the setting voltage values of the condenser lens electrode 102 and the objective lens electrode 105 for each irradiation mode, which are stored in the storage portion 13 in advance. In this case, the setting voltage value to be retrieved is a setting voltage value for an optimum irradiation mode based on the previously used irradiation mode. In other words, in the case where the previously used irradiation mode is the processing mode and is switched to the wide-range observation mode, the control portion 16 retrieves the setting voltage value for the wide-range observation mode of applying a voltage of −5 kV having a small voltage difference from the processing mode. In the case where the previously used irradiation mode is the observation mode and is switched to the wide-range observation mode, the control portion 16 retrieves the setting voltage value for the wide-range observation mode of applying a voltage of 20 kV having a small voltage difference from the observation mode.

Then, the control portion 16 sets the retrieved setting voltage values to the condenser lens power source 12 and the objective lens power source 15, and the condenser lens power source 12 and the objective lens power source 15 apply the voltages to the condenser lens electrode 102 and the objective lens electrode 105, respectively. In this case, if the setting voltage value is 0 kV, no voltage is applied.

As described above, even when using the wide-range observation mode, the irradiation mode can be switched smoothly without generating discharge.

The present invention provides illustrative, non-limiting aspects as follows:

(1) According to a first aspect, there is provided an ion beam apparatus including: an ion source configured to emit an ion beam; a condenser lens electrode configured to form a condenser lens for condensing the ion beam; a condenser lens power source configured to apply a voltage to the condenser lens electrode; a storage portion configured to store, a first voltage value to be applied to the condenser lens electrode and corresponding to an observation mode of irradiating a sample with the ion beam to observe the sample, a second voltage value to be applied to the condenser lens electrode and corresponding to a processing mode of irradiating the sample with the ion beam having a larger current amount than a current amount in the observation mode, a third voltage value to be applied to the condenser lens electrode and corresponding to a wide-range observation mode of irradiating the sample with the ion beam in a wider range than a range in the observation mode, and a fourth voltage value corresponding to the wide-range observation mode and being closer to the second voltage value with respect to the third voltage value;

and a control portion configured to retrieve the third voltage value from the storage portion and set the retrieved third voltage value to the condenser lens power source when the observation mode is switched to the wide-range observation mode, and retrieve the fourth voltage value from the storage portion and set the retrieved fourth voltage value to the condenser lens power source when the processing mode is switched to the wide-range observation mode.

(2) According to a second aspect, there is provided an ion beam apparatus including: an ion source configured to emit an ion beam; a condenser lens electrode configured to form a condenser lens for condensing the ion beam; a condenser lens power source configured to apply a voltage to the condenser lens electrode; a storage portion configured to store, a first voltage value to be applied to the condenser lens electrode and corresponding to an observation mode of irradiating a sample with the ion beam to observe the sample, a second voltage value to be applied to the condenser lens electrode and corresponding to a processing mode of irradiating the sample with the ion beam having a larger current amount than a current amount in the observation mode, a third voltage value to be applied to the condenser lens electrode and corresponding to a wide-range observation mode of irradiating the sample with the ion beam in a wider range than a range in the observation mode, and a fourth voltage value corresponding to the wide-range observation mode and by which a lens having a stronger lens effect than a lens effect of the condenser lens formed in the processing mode is formed; and a control portion configured to retrieve the third voltage value from the storage portion and set the retrieved third voltage value to the condenser lens power source when the observation mode is switched to the wide-range observation mode, and retrieve the fourth voltage value from the storage portion and set the retrieved fourth voltage value to the condenser lens power source when the processing mode is switched to the wide-range observation mode.

(3) According to a third aspect, there is provided the ion beam apparatus according to the second aspect, wherein the third voltage value includes a voltage value by which a lens having a weaker lens effect than a lens effect of the condenser lens formed in the observation mode is formed.

(4) According to a fourth aspect, there is provided the ion beam apparatus according to the first aspect or the third aspect, further including: an objective lens electrode configured to form an objective lens for focusing the ion beam onto the sample; and an objective lens power source configured to apply a voltage to the objective lens electrode, wherein the storage portion further stores, a first objective lens voltage value to be applied to the objective lens electrode and corresponding to the observation mode, a second objective lens voltage value to be applied to the objective lens electrode and corresponding to the processing mode, and a third objective lens voltage value to be applied to the objective lens electrode and corresponding to the wide-range observation mode, and wherein the control portion is configured to retrieve the third objective lens voltage value from the storage portion and set the retrieved third objective lens voltage value to the objective lens power source when the observation mode is switched to the wide-range observation mode or when the processing mode is switched to the wide-range observation mode.

(5) According to a fifth aspect, there is provided the ion beam apparatus according to the fourth aspect, wherein the third objective lens voltage value includes 0 kV.

(6) According to a sixth aspect, there is provided the ion beam apparatus according to any one of the first to fifth aspects, further including: an input portion to which a signal for switching between the observation mode, the processing mode, and the wide-range observation mode is configured to be inputted.

What is claimed is:

1. An ion beam apparatus comprising:
an ion source configured to emit an ion beam;
a condenser lens electrode configured to form a condenser lens for condensing the ion beam;
a condenser lens power source configured to apply a voltage to the condenser lens electrode;
a storage portion configured to store,
a first voltage value to be applied to the condenser lens electrode and corresponding to an observation mode of irradiating a sample with the ion beam to observe the sample,
a second voltage value to be applied to the condenser lens electrode and corresponding to a processing mode of irradiating the sample with the ion beam having a larger current amount than a current amount in the observation mode,
a third voltage value to be applied to the condenser lens electrode and corresponding to a wide-range observation mode of irradiating the sample with the ion beam in a wider range than a range in the observation mode, and
a fourth voltage value to be applied to the condenser lens electrode and corresponding to the wide-range observation mode and being closer to the second voltage value with respect to the third voltage value; and
a control portion configured to retrieve the third voltage value from the storage portion and set the retrieved third voltage value to the condenser lens power source only when the observation mode is switched to the wide-range observation mode, and retrieve the fourth voltage value from the storage portion and set the retrieved fourth voltage value to the condenser lens power source only when the processing mode is switched to the wide-range observation mode.

2. An ion beam apparatus comprising:
an ion source configured to emit an ion beam;
a condenser lens electrode configured to form a condenser lens for condensing the ion beam;
a condenser lens power source configured to apply a voltage to the condenser lens electrode;
a storage portion configured to store,
a first voltage value to be applied to the condenser lens electrode and corresponding to an observation mode of irradiating a sample with the ion beam to observe the sample,
a second voltage value to be applied to the condenser lens electrode and corresponding to a processing mode of irradiating the sample with the ion beam having a larger current amount than a current amount in the observation mode,
a third voltage value to be applied to the condenser lens electrode and corresponding to a wide-range observation mode of irradiating the sample with the ion beam in a wider range than a range in the observation mode, and
a fourth voltage value to be applied to the condenser lens electrode and corresponding to the wide-range observation mode and by which a lens having a stronger lens effect than a lens effect of the condenser lens formed in the processing mode is formed; and
a control portion configured to retrieve the third voltage value from the storage portion and set the retrieved third voltage value to the condenser lens power source only when the observation mode is switched to the wide-range observation mode, and retrieve the fourth voltage value from the storage portion and set the retrieved fourth voltage value to the condenser lens power source only when the processing mode is switched to the wide-range observation mode.

3. The ion beam apparatus according to claim 2, wherein the third voltage value is a voltage value by which a lens having a weaker lens effect than a lens effect of the condenser lens formed in the observation mode is formed.

4. The ion beam apparatus according to claim 1, further comprising:
an objective lens electrode configured to form an objective lens for focusing the ion beam onto the sample; and
an objective lens power source configured to apply a voltage to the objective lens electrode,
wherein the storage portion further stores,
a first objective lens voltage value to be applied to the objective lens electrode and corresponding to the observation mode,
a second objective lens voltage value to be applied to the objective lens electrode and corresponding to the processing mode, and
a third objective lens voltage value to be applied to the objective lens electrode and corresponding to the wide-range observation mode, and
wherein the control portion is configured to retrieve the third objective lens voltage value from the storage portion and set the retrieved third objective lens voltage value to the objective lens power source when the observation mode is switched to the wide-range observation mode or when the processing mode is switched to the wide-range observation mode.

5. The ion beam apparatus according to claim 4, wherein the third objective lens voltage value is 0 kV.

6. The ion beam apparatus according to claim 1, further comprising an input portion configured to input a signal for switching between the observation mode, the processing mode, and the wide-range observation mode.

* * * * *